United States Patent
Ajjikuttira et al.

[19]

[11] Patent Number: 6,114,919
[45] Date of Patent: Sep. 5, 2000

[54] HIGH FREQUENCY VOLTAGE CONTROLLED OSCILLATOR IC USING DIFFUSION CAPACITANCE MODULATION

[75] Inventors: Aruna B. Ajjikuttira; Gregory Yuen, both of Singapore, Singapore

[73] Assignee: Tritech Microelectronics, Ltd., Singapore, Singapore

[21] Appl. No.: 09/039,461

[22] Filed: Mar. 16, 1998

(Under 37 CFR 1.47)

[51] Int. Cl.[7] .................................................. H03B 5/18
[52] U.S. Cl. ................................. 331/117 R; 331/177 R
[58] Field of Search ......................... 331/117 R, 117 FE, 331/108 C, 108 D, 177 R, 177 V

[56] References Cited

U.S. PATENT DOCUMENTS

| | | | |
|---|---|---|---|
| 3,611,195 | 10/1971 | Parham | 331/117 R |
| 4,630,006 | 12/1986 | Anderson | 331/117 R |
| 5,055,889 | 10/1991 | Beall | 357/14 |
| 5,107,228 | 4/1992 | Pham et al. | 331/117 R |
| 5,130,674 | 7/1992 | Pham et al. | 331/117 R |
| 5,187,450 | 2/1993 | Wagner et al. | 331/96 |
| 5,191,301 | 3/1993 | Mullgras, Jr. | 331/57 |

OTHER PUBLICATIONS

Wyatt et al. "Varactorless HF Modulator", 1994 issue of Electronic Design, Oct. 3, 1994.

*Primary Examiner*—Siegfried H. Grimm
*Attorney, Agent, or Firm*—George O. Saile; Stephen B. Ackerman

[57] ABSTRACT

A variable high frequency voltage controlled oscillator (VCO) which is fully integrated. By controlling, with a control voltage, the collector current flowing through one transistor of the integrated oscillator circuit, the diffusion capacitance (also known as base-charging capacitance) of that transistor is varied. Since, in conjunction with an inductance, this capacitance to a large degree determines the frequency of oscillation of the integrated circuit, a fully integrated VCO is made possible.

23 Claims, 5 Drawing Sheets

HIGH FREQUENCY VOLTAGE CONTROLLED OSCILLATOR IC USING DIFFUSION CAPACITANCE MODULATION

BACKGROUND OF THE INVENTION

1. Field of the Invention

The invention relates to the field of integrated circuits and, more particularly, to a high frequency, voltage controlled oscillator that can be fully integrated.

2. Description of the Prior Art

Oscillators are astable circuits which find many uses in electronic equipment, both stationary and portable. Oscillators frequently consist of one or two transistors, an inductor (L), and a capacitor (C) in an LC tank circuit, followed by a buffering amplifier. Oscillators have followed the trend toward circuit integration, but external devices are still required for many reasons. Reasons are stability of oscillation requiring special components such as crystal oscillators, or the need of an inductor as part of the LC tank circuit, or the use of a voltage variable capacitor (varactor) also known as variable-reactance diode.

An example of the prior art is disclosed in U.S. Pat. No. 5,055,889 (Beall), which provides a lateral varactor that can be implemented in a MESFET integrated circuit. The fabrication methods for MESFET's are not suitable for bipolar circuits. U.S. Pat. No. 5,187,450 (Wagner et al.) describes a high-frequency voltage controlled oscillator (VCO) that can be implemented on a single integrated circuit (IC), without a varactor, but an external LC network is still required for frequency control. A highly stable, high frequency VCO for phase locked loops is disclosed in U.S. Pat. No. 5,191,301 (Mullgrav, Jr.). Here, the design may be integrated on a single chip; however, voltage control of the frequency is achieved by d.c. differential amplifiers coupled to a series of logic blocks formed in a ring.

In the Oct. 3, 1994 issue of Electronic Design an article was published by Michael A. Wyatt and Larry A. Geis, titled "Varactorless HF Modulator". In it a circuit is described which utilizes the base-charging capacitance of a transistor in conjunction with a high-quality, low-loss, ceramic coaxial shorted quarter-wave transmission line. Sustained oscillations are produced when a negative resistance "seen" at the base of the transistor reacts with the transmission line.

SUMMARY OF THE INVENTION

It is an object of the present invention to provide circuits and a method for a variable frequency, voltage controlled oscillator which is fully integrated.

Another object of the present invention is to provide a circuit for a variable frequency, voltage controlled oscillator where the control voltage is within the range of the supply voltage.

These objects have been achieved by varying, with a control voltage, the diffusion capacitance of one transistor of a high frequency, integrated oscillator circuit. A change in the diffusion capacitance affects the capacitance of the oscillator's LC network and, thereby, changes the frequency of oscillation of the circuit.

DESCRIPTION OF THE PREFERRED EMBODIMENT

Figure 1:
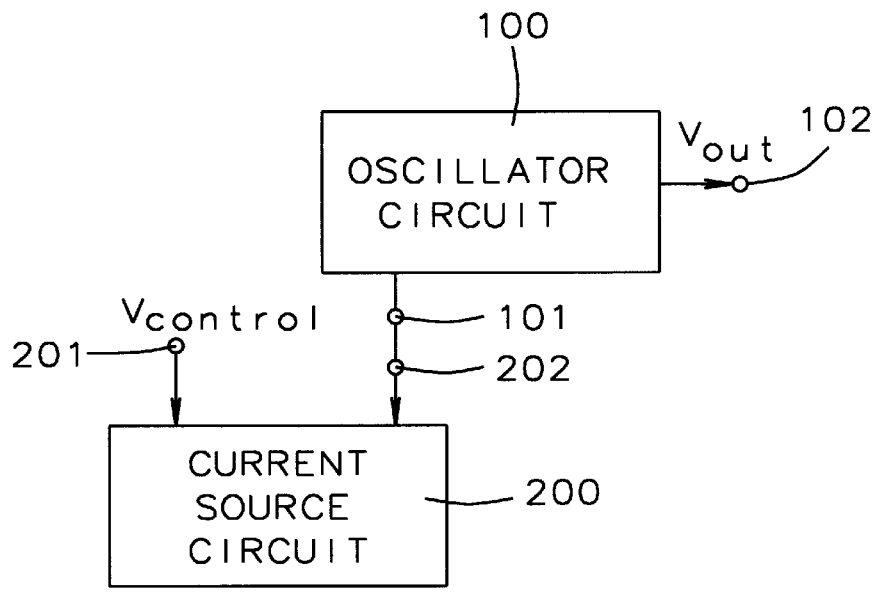
FIG. 1 is a high level block diagram of the present invention.

Referring now to FIG. 1, we show a high level block diagram according to a preferred embodiment of this invention. Oscillator Circuit 100 has output 101 and output 102 ($V_{OUT}$). Current Source Circuit 200 has input 201 ($V_{CONTROL}$) and input 202. Input 201 controls current $I_{CONTROL}$ flowing from output 101 to input 202. $I_{CONTROL}$ can be implemented many ways, such as using a simple resistor or any of the existing current source circuits. A preferred embodiment of such a current source circuit will be shown later.

Figure 2:
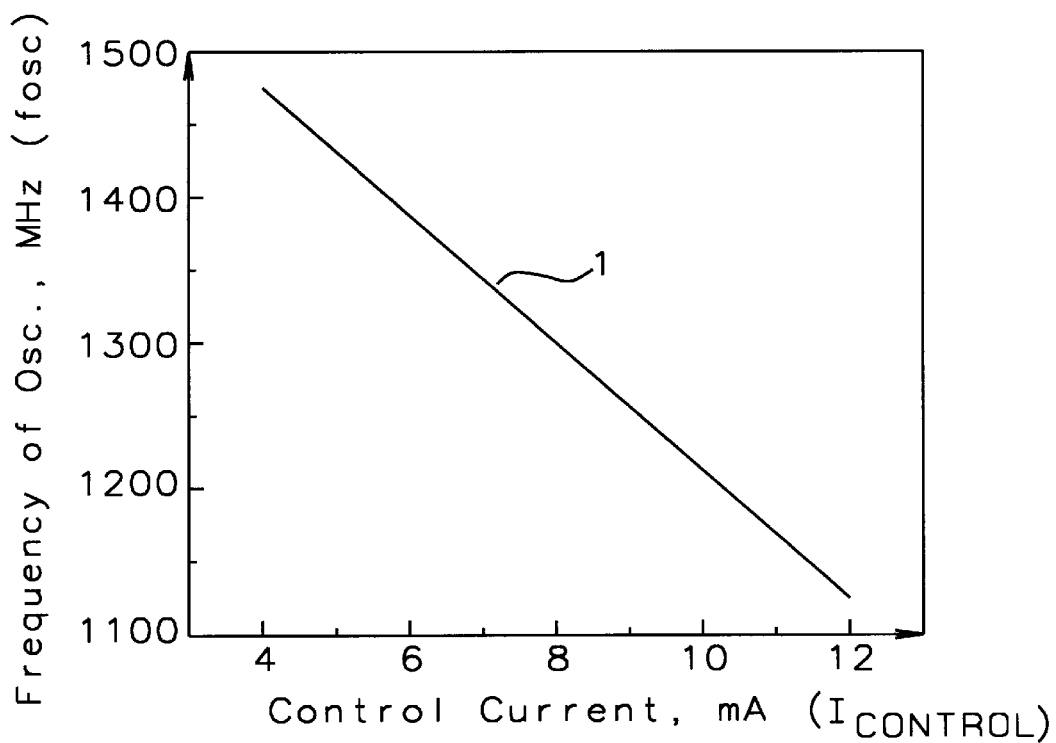
FIG. 2 is a graph of the control current and frequency of the output signal of the circuit as shown in FIG. 1.

FIG. 2 is a graph, where Curve 1 relates the frequency of oscillation $f_{OSC}$ on the y-axis to the current $I_{CONTROL}$ on the x-axis. It is apparent that for most of the range of $I_{CONTROL}$ the frequency decreases monotonically. $I_{CONTROL}$, therefore, is well suited to controlling the oscillator frequency.

Figure 3:
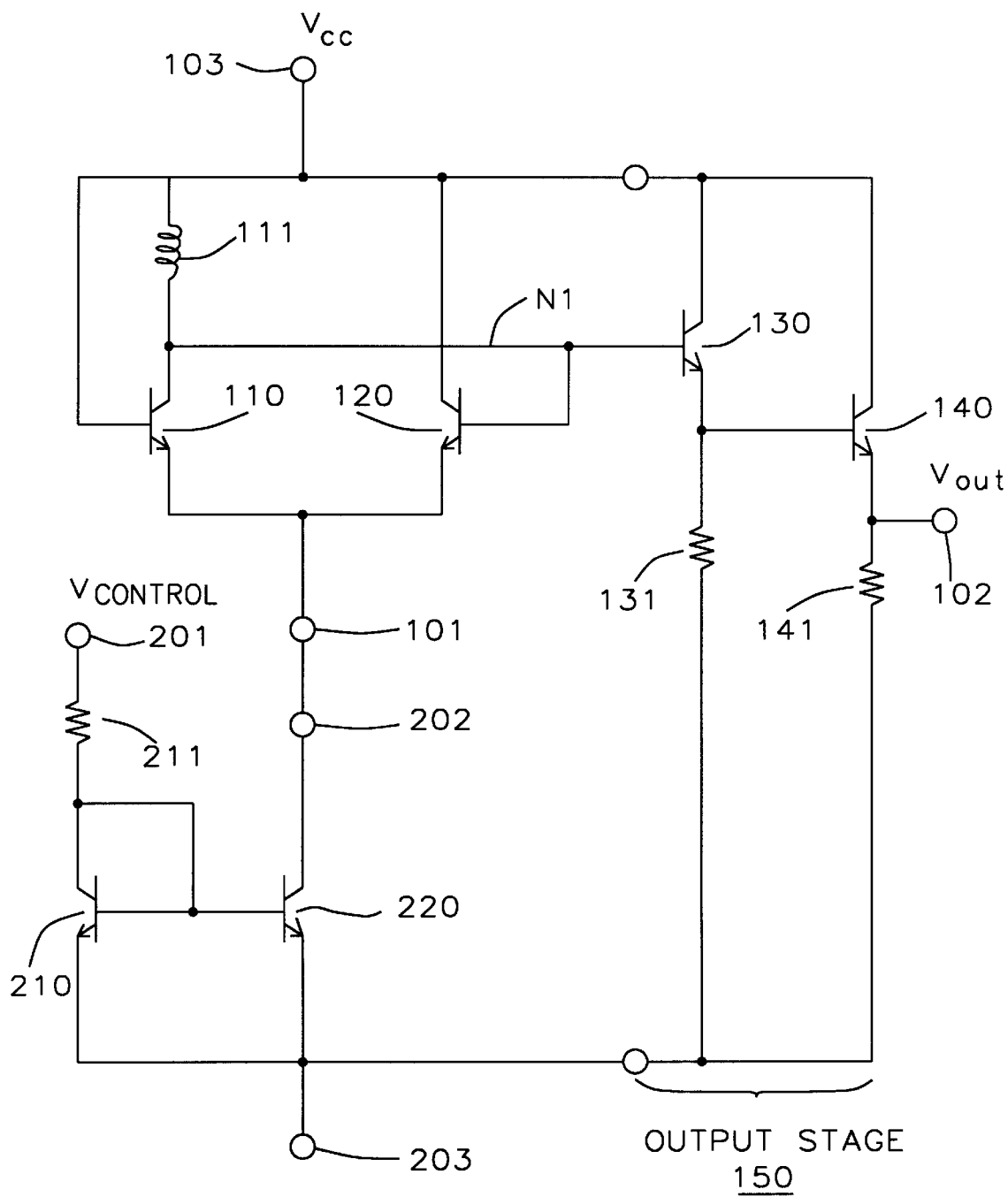
FIG. 3 is a circuit diagram of the present invention.

Referring now to FIG. 3, we show a circuit diagram according to an embodiment of the invention. Transistor pair 110 and 120 form the oscillator. The inductor 111 together with the total capacitance from Node N1 to ground, namely C1, determines the frequency of oscillation. A major part of C1 is formed by the diffusion capacitance (also known as base-charging capacitance) of transistor 120. The diffusion capacitance $C_D$ of a bipolar transistor is given by:

$$C_D = \tau_F \frac{qI_C}{kT}$$

where $\tau_F$ is the base transit time, $I_C$ is the collector current, q is the electron charge, k is Boltzmann's constant and T is the temperature in Kelvin.

For this circuit, $I_{CONTROL}$ is given by the sum of the collector currents of transistors 110 and 120. Thus, by changing $I_{CONTROL}$ the frequency of oscillation can be varied.

Still referring to FIG. 3, the voltage reference $V_{CC}$ is connected to terminal 103, and the reference potential is connected to terminal 203. Transistors 110 and 120 have their emitters connected to output 101. The base of transistor 110 is connected to terminal 103 and the collector is connected to inductor 111. The other side of inductor 111 is connected to terminal 103, as is the collector of transistor 120. The base of transistor 120 is connected to both the collector of transistor 110 and the base of transistor 130. This node is labeled node N1. Output stage 150 buffers the oscillator from output 102 ($V_{OUT}$) by providing signal amplification. Still referring to FIG. 3 an embodiment of the output stage 150 is shown using npn transistors. Transistor 130 with its emitter resistor 131, and transistor 140 with its emitter resistor 141 are emitter follower circuits and provide current amplification for output 102 ($V_{OUT}$), with a low impedance output of typically 50 ohms. The low output impedance of an emitter follower matches the impedance of external test equipment and is therefore preferred when making measurements on the oscillator.

Figure 4A:
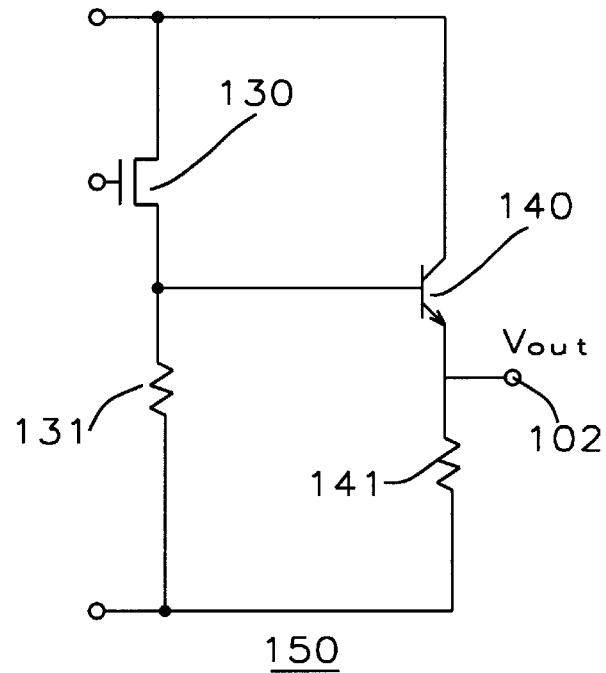
FIGS. 4a and 4b are circuit diagrams showing different embodiments of the output stage of the circuit of FIG. 3.
Figure 4B:
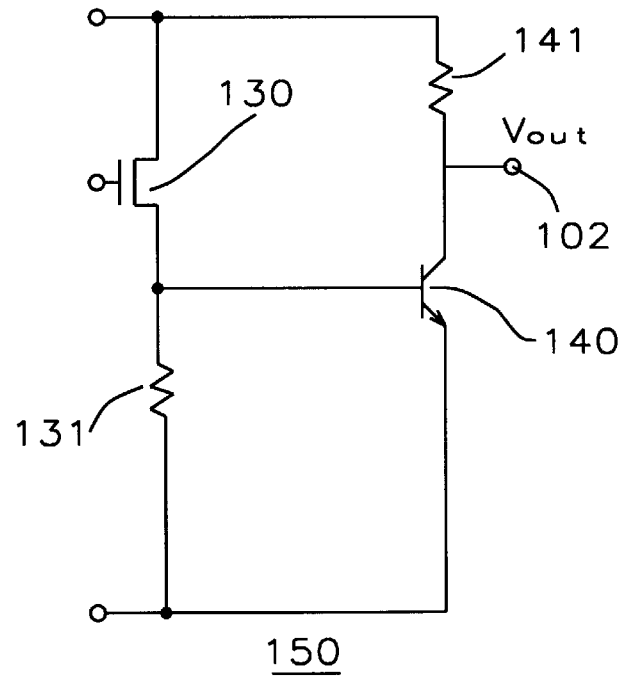

FIGS. 4a, and 4b, show two other embodiments of the output stage 150. In the embodiment of FIG. 4a, transistor 130 is implemented as a n-channel metal oxide semiconductor field effect transistor (MOSFET). Since a MOSFET provides a much higher input impedance than a bipolar transistor there is less loading on the tank circuit (comprising transistors 110 and 120, inductor 111, and node capacitance N1), resulting in better phase-noise performance. In the embodiment shown in FIG. 4b, resistor 141 is placed between terminal 103 ($V_{CC}$) and the collector of transistor 140, changing the output stage from an emitter follower to a common emitter configuration. In contrast to an emitter follower stage, the output impedance of a common emitter stage can be nicely matched to the typical impedance of an integrated circuit of about 300 ohms, and is therefore preferred when the oscillator is used in an integrated circuit. Other variations of transistor type and choice of circuit for the output stage are possible and known to those skilled in the art.

The preferred embodiment of the Current Source Circuit 200 consists of transistors 210 and 220. The collector of transistor 210 is connected through resistor 211 to input 201 ($V_{CONTROL}$). Both bases are connected to each other, while both emitters are connected to the reference potential, terminal 203. Transistor 210 is a current source by having its collector connected to its base. The collector of transistor 220 is connected to input 202, which is connected to output 101 of the Oscillator Circuit 100. When $V_{CONTROL}$ is increased, the current flowing into the base of transistor 220 is increased, thus increasing the current flowing into the collector of transistor 220. A voltage change at input 201, which can vary between approximately 1 volt and $V_{CC}$, provides thus a convenient means of current control for transistor 120, and causes the oscillating voltage at output 102 to be varied in frequency. Other embodiments of the current source circuit are also possible. In addition, $I_{CONTROL}$ may be implemented using a simple resistor.

Figure 5:
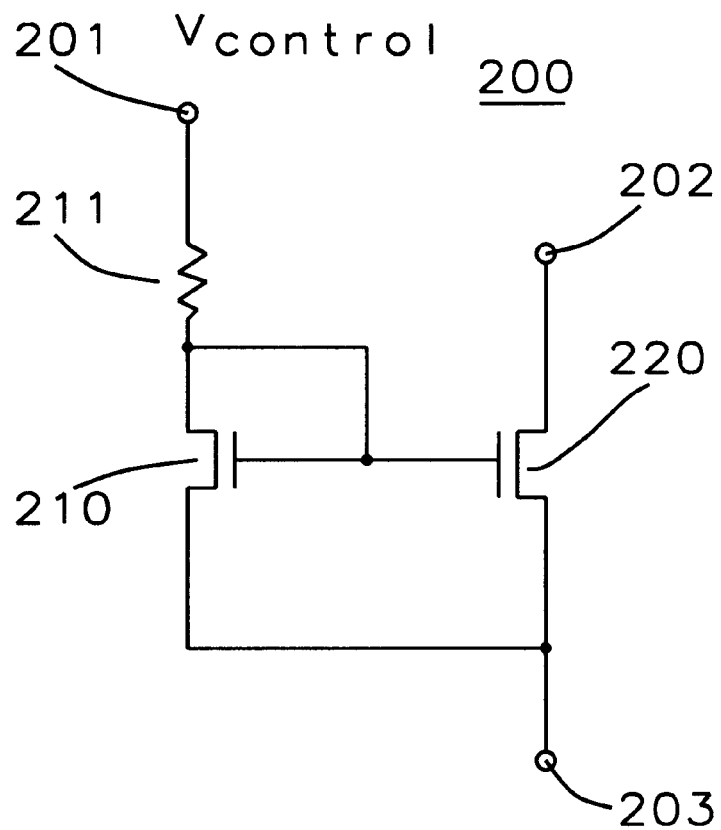
FIG. 5 is a circuit diagram showing a different embodiment of the current source of the circuit of FIG. 3.

One other embodiment of current source 200 is illustrated in FIG. 5. Both transistors 210 and 220 are implemented as n-channel MOSFET transistors. Other embodiments, such as using p-channel MOSFET transistors, are possible and known to those skilled in the art.

Figure 6:
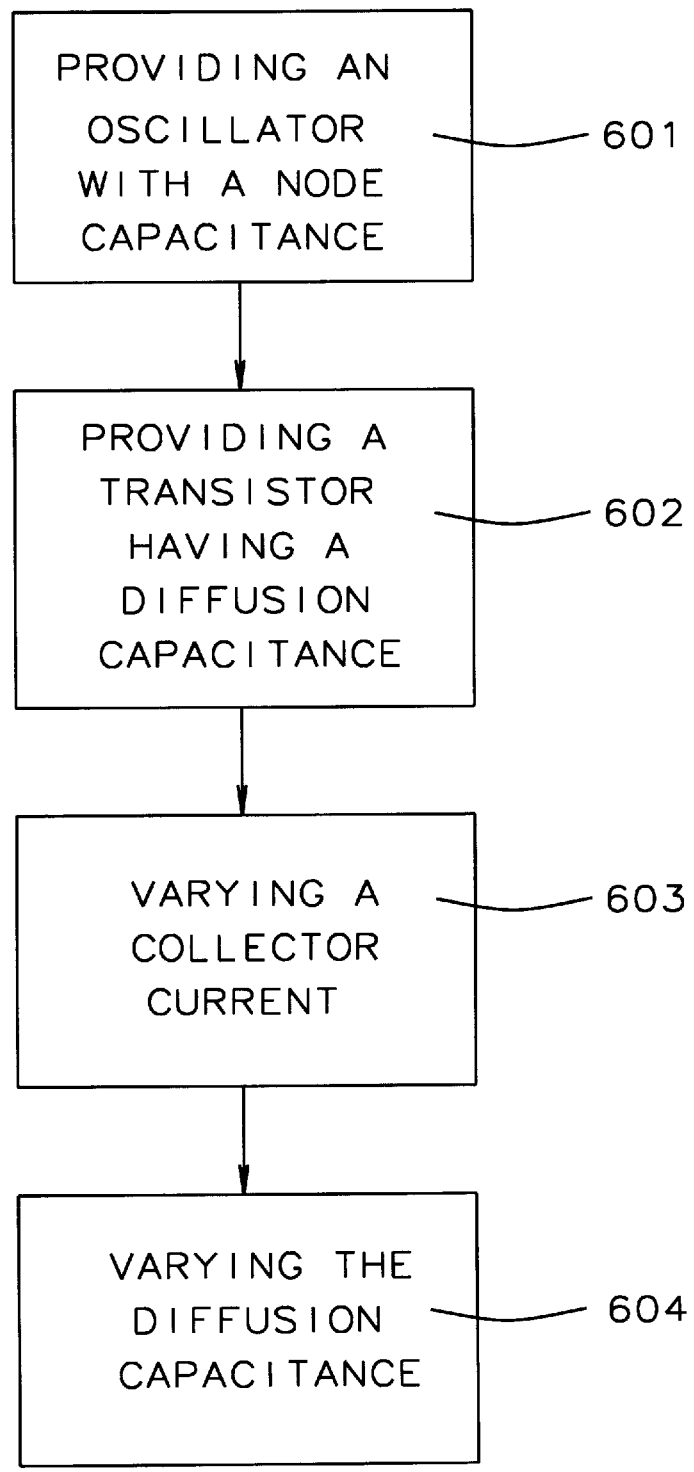
FIG. 6 is a block diagram illustrating the method of the present invention.

Referring now to FIG. 6, we show a block diagram of the method of the present invention. Block 601 shows providing an oscillator with an LC network, which furnishes the time constant for the frequency of oscillation. In Block 602, a transistor for the oscillator is provided having a diffusion capacitance $C_D$. This diffusion capacitance is a significant part of the capacitance C of the LC network. Block 603 shows varying the collector current of the transistor. By varying the collector current, the diffusion capacitance is varied as indicated in Block 604, thus changing the capacitance C of the LC time constant and, thereby, the frequency of oscillation. Varying the collector current can be achieved by the use of a current source circuit.

One advantages of the described circuits and method of this invention is that implementing the modulation of the diffusion capacitance is inexpensive, thus minimizing cost. A second advantage of this invention is that now a variable frequency, voltage controlled oscillator can be fully integrated into an IC, avoiding any or all external devices. A third advantage is that the voltage required to vary $I_{CONTROL}$ is within the range of the supply voltage $V_{CC}$. This is of great importance in portable systems with limited, single voltage supplies.

The disadvantage of the prior art, using a variable capacitance diode (varactor), is that a varactor is an external device and is difficult to integrate, and that it requires a large voltage swing (typically 6 volt) to achieve a reasonable capacitance change. This can be a problem in many portable systems where the battery voltages are limited. Also varactors do not permit linear control of frequency in contrast to this present invention and as discussed earlier and shown in the graph of FIG. 2.

The present invention also differs from the circuit described in the Oct. 3, 1997 article in 'Electronic Design', and referenced in 'Description of Prior Art' earlier in this document by not requiring an external transmission line. A high-quality, low-loss, ceramic coaxial shorted quarter-wave transmission line adds extra expense to a product. Additionally, the change in frequency is very small. In contrast, in the present invention the control current changes a lot and the frequency of operation varies over several hundred MegaHertz. For example, FIG. 2 shows the control current ranging from 4 mA to 12 mA and the frequency ranging from nearly 1100 MHz to almost 1500 MHz.

While the invention has been particularly shown and described with reference to the preferred embodiments thereof, it will be understood by those skilled in the art that various changes in form and details may be made without departing from the spirit and scope of the invention.

What is claimed is:

1. A voltage controlled oscillator circuit, comprising:
    an oscillator circuit with a first output, a second output, a first transistor, a second transistor, a third transistor, a fourth transistor, and an integrated inductive element, said first and said second transistor coupled to said inductive element to form an oscillator with a frequency f, said second transistor capable of modulating said frequency f in the range from 1,470 MHz to 1,130 MHz by varying a base-charging capacitance of said second transistor, said third and said fourth transistor providing output buffering for said frequency f;
    a current source circuit, with a first input, a second input, a fifth transistor providing a current source, and a sixth transistor providing a current sink at said second input, said second input connected to said first output, said current source circuit providing a varying current ranging from 4 mA to 12 mA to the emitter of said second transistor, said varying current thereby changing said base-charging capacitance of said second transistor, said varying current thus effecting a linear change of said frequency f;
    a voltage potential connected to said oscillator circuit; and
    a reference potential connected to said oscillator circuit and said current source circuit.

2. The circuit of claim 1, wherein said oscillator circuit comprises:
    an inductor, with one end connected to said voltage potential and the other end connected to a node N1;
    said first transistor being a npn transistor, with a base, an emitter, and a collector, said base of said first transistor connected to said voltage potential, said emitter of said first transistor connected to said first output, and said collector of said first transistor connected to said node N1;
    said second transistor being a npn transistor, with a base, an emitter, and a collector, said base of said second transistor connected to said node N1, said emitter of said second transistor connected to said first output, and said collector of said second transistor connected to said voltage potential;
    said third transistor being a npn transistor, with a base, an emitter, and a collector, said base of said third transistor connected to said node N1, and said collector of said third transistor connected to said voltage potential;

said fourth transistor being a npn transistor, with a base, an emitter, and a collector, said base of said fourth transistor connected to said emitter of said third transistor, said emitter of said fourth transistor connected to said second output, and said collector of said fourth transistor connected to said voltage potential;

a first resistor, with one end connected to said emitter of said third transistor, and the other end of said first resistor connected to said reference potential; and a second resistor, with one end connected to said emitter of said fourth transistor, and the other end of said second resistor connected to said reference potential.

3. The circuit of claim 1, wherein said current source circuit comprises:

said first input, to which a first signal is applied;

said second input, connected to said first output;

said reference potential;

a third resistor, with a first terminal and a second terminal, said first terminal of said third resistor connected to said first input;

said fifth transistor being a npn transistor, with a base, an emitter, and a collector, said base of said fifth transistor connected to said second terminal of said third resistor, said emitter of said fifth transistor connected to said reference potential, and said collector of said fifth transistor connected to said second terminal of said third resistor; and said sixth transistor being a npn transistor, with a base, an emitter, and a collector, said base of said sixth transistor connected to said second terminal of said third resistor, said emitter of said sixth transistor connected to said reference potential, and said collector of said sixth transistor connected to said second input.

4. The circuit of claim 2, wherein said oscillator circuit produces an oscillating voltage signal at said second output.

5. The circuit of claim 2, wherein said node N1 has a node capacitance, said node capacitance affecting said variable frequency of said oscillating voltage signal.

6. The circuit of claim 2, wherein said second transistor has a diffusion capacitance.

7. The circuit of claim 6, wherein said diffusion capacitance of said second transistor contributes to said node capacitance of said node N1.

8. The circuit of claim 6, wherein said oscillating voltage signal varies in frequency by varying said diffusion capacitance of said second transistor.

9. The circuit of claim 7, wherein said diffusion capacitance of said second transistor is varied by varying a collector current flowing through said collector of said second transistor.

10. The circuit of claim 9, wherein said collector current flowing through said collector of said second transistor is varied by varying an output current flowing out of said first output.

11. The circuit of claim 10, wherein said output current flowing out of said first output is varied by a current source comprised of at least one MOS transistor.

12. The circuit of claim 10, wherein said output current flowing out of said first output is varied by a resistor.

13. The circuit of claim 3, wherein said first signal applied to said first input comprises a voltage signal ranging from 1 Volt to said voltage potential.

14. The circuit of claim 3, wherein said first signal applied to said first input controls said sixth transistor of said current source circuit.

15. The circuit of claim 10, wherein said sixth transistor of said current source circuit varies said output current flowing out of said first output.

16. An oscillator circuit, comprising:

a voltage potential;

a reference potential;

a first output;

an oscillator output;

an inductor, with one end connected to said voltage potential and the other end connected to a node N1;

a first transistor being a npn transistor, with a base, an emitter, and a collector, said base of said first transistor connected to said voltage potential, said emitter of said first transistor connected to said first output, and said collector of said first transistor connected to said node N1;

a second transistor being a npn transistor, with a base, an emitter, and a collector, said base of said second transistor connected to said node N1, said emitter of said second transistor connected to said first output, and said collector of said second transistor connected to said voltage potential;

a third transistor being a n-channel transistor, having a drain-source path and a gate, said drain of said third transistor connected to said voltage potential, and said gate of said third transistor connected to said node N1;

a fourth transistor being a npn transistor, with a base, an emitter, and a collector, said base of said fourth transistor connected to said source of said third transistor, said emitter of said fourth transistor connected to said oscillator output, and said collector of said fourth transistor connected to said voltage potential;

a first resistor, with one end connected to said source of said third transistor, and the other end of said first resistor connected to said reference potential; and a second resistor, with one end connected to said emitter of said fourth transistor, and the other end of said second resistor connected to said reference potential.

17. An oscillator circuit, comprising:

a voltage potential;

a reference potential;

a first output;

an oscillator output;

an inductor, with one end connected to said voltage potential and the other end connected to a node N1;

a first transistor being a npn transistor, with a base, an emitter, and a collector, said base of said first transistor connected to said voltage potential, said emitter of said first transistor connected to said first output, and said collector of said first transistor connected to said node N1;

a second transistor being a npn transistor, with a base, an emitter, and a collector, said base of said second transistor connected to said node N1, said emitter of said second transistor connected to said first output, and said collector of said second transistor connected to said voltage potential;

a third transistor being a n-channel transistor, having a drain-source path and a gate, said drain of said third transistor connected to said voltage potential, and said gate of said third transistor connected to said node N1;

a fourth transistor being a npn transistor, with a base, an emitter, and a collector, said base of said fourth transistor connected to said source of said third transistor, said emitter of said fourth transistor connected to said reference potential, and said collector of said fourth transistor connected to said oscillator output;

a first resistor, with one end connected to said source of said third transistor, and the other end of said first resistor connected to said reference potential; and a second resistor, with one end connected to said collector of said fourth transistor, and the other end of said second resistor connected to said voltage potential.

18. The circuit of claim 17, wherein said oscillator output has an output impedance that matches an impedance of an integrated circuit.

19. A current source circuit, comprising:

a first input, to which a first signal is applied;

a second input, drawing a changing current when said first signal changes;

a reference potential;

a third resistor, with a first terminal and a second terminal, said first terminal of said third resistor connected to said first input;

a fifth transistor being a n-channel transistor, having a drain-source path and a gate, said drain-source path of said fifth transistor connected between said second terminal of said third resistor and said reference potential, and said gate of said fifth transistor connected to said second terminal of said third resistor; and a sixth transistor being a n-channel transistor, having a drain-source path and a gate, said drain-source path of said sixth transistor connected between said second input and said reference potential, and said gate of said sixth transistor connected to said second terminal of said third resistor.

20. A method of varying a frequency of oscillation of an integrated oscillator circuit, comprising:

providing an oscillator circuit with a node capacitance;

providing said oscillator circuit with a transistor having a diffusion capacitance;

providing a current source with a first and a second input terminal;

applying a varying input signal at said first input terminal, said input signal ranging from 1 Volt to the supply voltage of said integrated oscillator circuit;

connecting said second input terminal to the emitter of said transistor, said second input terminal providing a source of current;

said varying input signal varying said current at said second input terminal;

varying said current flowing through said emitter in the range from 4 mA to 12 mA;

varying said diffusion capacitance thereby;

modulating thus said node capacitance; and thereby linearly changing said frequency of oscillation, said changing frequency ranging from 1,470 MHz to 1,130 MHz.

21. The method of claim 20, wherein varying said current flowing through said transistor, varies said diffusion capacitance.

22. The method of claim 20, wherein varying said diffusion capacitance varies said node capacitance.

23. The method of claim 20, wherein varying said node capacitance varies said frequency of said oscillator circuit.

* * * * *